United States Patent [19]
Ramalho et al.

[11] Patent Number: 5,841,603
[45] Date of Patent: Nov. 24, 1998

[54] ARRANGEMENT COMPRISING A MAGNETIC WRITE HEAD, AND WRITE AMPLIFIER WITH CAPACITIVE FEED-FORWARD COMPENSATION

[75] Inventors: Joao N. V. L. Ramalho, Eindhoven, Netherlands; Eric B. M. F. Desbonnets, Caen, France

[73] Assignee: U.S. Philips Corporation, New York, N.Y.

[21] Appl. No.: 752,866

[22] Filed: Nov. 20, 1996

[30] Foreign Application Priority Data

Nov. 21, 1995 [EP] European Pat. Off. .............. 95203187

[51] Int. Cl.[6] ...................................................... G11B 5/02
[52] U.S. Cl. ............................................. 360/68; 330/288
[58] Field of Search .................................. 360/46, 67, 68; 323/315; 330/258, 288, 146; 381/18

[56] References Cited

U.S. PATENT DOCUMENTS

| | | | |
|---|---|---|---|
| 5,278,912 | 1/1994 | Waldhauer | 381/18 |
| 5,282,094 | 1/1994 | Ngo | 360/46 |
| 5,315,231 | 5/1994 | Linder et al. | 323/315 |
| 5,559,646 | 9/1996 | Voorman et al. | 360/67 |
| 5,568,091 | 10/1996 | Ramalho et al. | 330/258 |
| 5,668,676 | 9/1997 | Voorman et al. | 360/46 |

*Primary Examiner*—Aristotelis M. Psitos
*Assistant Examiner*—Patrick Wamsley
*Attorney, Agent, or Firm*—Leroy Eason

[57] ABSTRACT

A write amplifier comprising four current mirrors which are turned on two at a time by two switchable floating current sources between the input terminals of the current mirrors in order to produce a write current of alternating polarity through the write head. The parasitic capacitances across the write head and/or the parasitic capacitances of the write amplifier at the write terminals are compensated by means of feed-forward capacitors. The high impedance at the terminals of the write head enables the common-mode voltage across the write head to be fixed at any desired voltage value by means of a common-mode circuit.

17 Claims, 10 Drawing Sheets

ARRANGEMENT COMPRISING A MAGNETIC WRITE HEAD, AND WRITE AMPLIFIER WITH CAPACITIVE FEED-FORWARD COMPENSATION

BACKGROUND OF THE INVENTION

1. Field of the Invention

The invention relates to an arrangement for recording an information signal on a magnetic record carrier, comprising a write head for recording information on the record carrier, and a write amplifier comprising:

a first signal terminal and a second signal terminal for receiving opposite signals representative of the information signal;

a first write terminal and a second write terminal, which are coupled to the write head to drive the write head in response to the information signal;

a first supply terminal and a second supply terminal for connection of a supply voltage for the write amplifier;

a first current mirror having a first current input terminal, a first current output terminal coupled to the first write terminal, and a first common current terminal connected to the first supply terminal;

a second current mirror having a second current input terminal, a second current output terminal coupled to the second write terminal, and a second common current terminal connected to the first supply terminal; and current switching means for enabling a current flow via a first current path between the first current output terminal and the second supply terminal via the first write terminal and the second write terminal for a first value of the information signal and for enabling a current flow via a second current path between the second current output terminal and the second supply terminal via the second write terminal and the first write terminal for a second value of the information signal.

2. Description of the Related Art

The invention also relates to a write amplifier for use in such an arrangement.

Such an arrangement and write amplifier are known from U.S. Pat. No. 5,282,094, FIG. 1. Write amplifiers having inductive write heads are used inter alia in hard disk drives for the storage of digital information signals, the polarity of the write current through the write head being reversed in response to the bit pattern of the information signal. There is a constant trend to increase the storage capacity of hard disk drives. In order to minimise the time needed to store the growing amount of data there is a constant tendency towards acceleration of the data transfer by stepping up the bit rate. This requires an increasingly faster polarity reversal of the write current. A problem which then arises is that the write current will no longer flow through the write head alone but also through parasitic capacitances present at the first and the second write terminal. These parasitic capacitances are caused by internal capacitances of the write amplifier, the parasitic capacitance across the write head itself and wiring capacitances of the wires connecting the write head to the first and the second write terminal of the write amplifier. The write current through the write head is distorted at high bit rates, as a result of which the recording on the information carrier becomes inaccurate.

SUMMARY OF THE INVENTION

It is an object of the invention to improve the accuracy of the information storage at high bit rates. To this end, in accordance with the invention, the arrangement of the type defined in the opening paragraph is characterised in that the write amplifier further comprises at least one of:

first compensation means for adding to the first current input terminal a capacitive current having a direction corresponding to the direction of the current flow in the first current path in response to the information signal; and second compensation means for adding to the second current input terminal a capacitive current having a direction corresponding to the direction of the current flow in the second current path in response to the information signal.

During signal transitions the first and second compensation means feed capacitive charge via the current mirrors to the write terminals. These additional capacitive currents help to compensate the capacitive currents flowing into the parasitic capacitances, thus improving the slew rate in the write head. As the compensation is based on feed-forward, over-compensation only results in overshoot, but not in instability.

According to the invention a feed-forward compensation can be obtained with an embodiment which is characterised in that the first compensation means comprise a first feed-forward capacitor inserted between the first current input terminal and the second signal terminal and the second compensation means comprise a second feed-forward capacitor inserted between the second current input terminal and the first signal terminal. For an optimum effect the capacitors are preferably used in pairs, i.e. the first together with the second, in order not to disturb the symmetry of the arrangement.

In the known arrangement polarity reversal of the current through the write head is effected with current switching means which establish a low-impedance connection between one of the write terminals and the second supply terminal. The other write terminal is then connected to the high-impedance current output terminal of the first or the second current mirror. As a result, the common-mode voltage across the write head does not have a fixed value and depends on the number of ones or zeros of the preceding bit pattern of the information signal. Consequently, the following bit change can be influenced by the common-mode voltage just before the change, which may give rise to bit-pattern-dependent signal distortion. Moreover, the fluctuating common-mode voltage may produce crosstalk to other sensitive circuits. These problems limit the bit rate of the information signal to be recorded. An embodiment of the invention having a write amplifier whose structure makes it better suitable for high bit rates is characterised in that the current switching means comprise:

a third current mirror having a third current input terminal, a third current output terminal coupled to the first write terminal, and a third common current terminal connected to the second supply terminal;

a fourth current mirror having a fourth current input terminal, a fourth current output terminal coupled to the second write terminal, and a fourth common current terminal connected to the second supply terminal;

a first switchable current source connected between the first current input terminal and the fourth current input terminal for supplying a first current for a first value of the information signal;

a second switchable current source connected between the second current input terminal and the third current input terminal for supplying a second current for the second value of the information signal.

The write head is now connected between the high-impedance outputs of four current mirrors, which are turned on two at a time by means of the switchable current sources. When the first switchable current source conducts, a current will flow through the write head from the first supply terminal to the second supply terminal via the first and the fourth current mirror. When the second switchable current source conducts, an opposite current will flow through the write head from the first supply terminal to the second supply terminal via the second and the third current mirror. Since the write head is connected between the high-impedance current output terminals of the four current mirrors, the common-mode voltage can be fixed as required by additional measures, preferably at half the supply voltage, and can be rendered independent of the bit pattern. The current mirrors then saturate only during the peaks of the write head voltage and no clamping circuits are needed to preclude oversaturation of the output transistors of the write amplifier.

If desired, the third and the fourth current mirror may also be used for feed-forward compensating the parasitic capacitances, for which purpose the arrangement in accordance with the invention is further characterised in that the write amplifier further comprises at least one of a third feed-forward capacitor inserted between the third current input terminal and the second signal terminal and a fourth feed-forward capacitor inserted between the fourth current input terminal and the first signal terminal.

The four feed-forward capacitors need to be driven by the information signal at the first and second signal terminals. In order to reduce the capacitive load of the information signal source an embodiment of the arrangement according to the invention is characterised in that the write amplifier further comprises:

first, second, third and fourth driver transistors of a first conductivity type, each having a control electrode, a first main electrode and a second main electrode, the control electrodes of the first and second transistors being coupled to the first signal terminal, the control electrodes of the third and fourth transistors being coupled to the second signal terminal;

fifth, sixth, seventh and eighth transistors of a second conductivity type, each having a control electrode, a first main electrode and a second main electrode;

a first and a second bias current source, the control electrodes of the fifth and sixth transistors and the second main electrode of the fifth transistor being coupled to the second supply terminal via the first bias current source, and the control electrodes of the seventh and eighth transistors and the second main electrode of the eighth transistor being coupled to the second supply terminal via the second bias current source;

first, second, third and fourth coupling resistors for coupling, respectively, the first main electrode of the first transistor to the first main electrode of the fifth transistor, the first main electrode of the second transistor to the first main electrode of the sixth transistor, the first main electrode of the third transistor to the first main electrode of the seventh transistor, the first main electrode of the fourth transistor to the first main electrode of the eighth transistor;

a first capacitor coupling the first main electrode of the second transistor to the first main electrode of the seventh transistor and a second capacitor coupling the first main electrode of the third transistor to the first main electrode of the sixth transistor;

the second main electrodes of the first and fourth transistors being coupled to the first supply terminal; and the second main electrodes of the second, third, sixth and seventh transistors being coupled to, respectively, the first current input terminal, the second current input terminal, the third current input terminal and the fourth current input terminal.

This arrangement buffers the information signal, is fully balanced and uses only two feed-forward capacitors instead of four.

The four current mirrors may be of any suitable type. For a maximal swing of the write amplifier a preferred embodiment of the arrangement in accordance with the invention is characterised in that the third current mirror and the fourth current mirror each comprise a diode-connected input transistor of a first conductivity type having a control electrode and a second main electrode connected to the third and the fourth current input terminal, respectively, and having a first main electrode coupled to the second supply terminal, and an output transistor of the first conductivity type having a control electrode connected to the control electrode of the relevant input transistor, a first main electrode coupled to the second supply terminal, and a second main electrode connected to the third and the fourth current output terminal, and in that the first current mirror and the second current mirror each comprise a diode-connected input transistor of a second conductivity type having a control electrode and a second main electrode connected to the first and the second current input terminal, respectively, and having a first main electrode coupled to the first supply terminal, and an output transistor of the second conductivity type having a control electrode connected to the control electrode of the relevant input transistor, a first main electrode coupled to the first supply terminal, and a second main electrode connected to the first and the second current output terminal.

Current mirrors thus implemented produce a minimal voltage loss and allow an output swing up to nearly the supply voltage. Moreover, they have basically a single pole in the current transfer function, so that no additional ringing of the waveform is produced. Ringing may lead to inter-symbol interference.

It is to be noted that the transistors may be bipolar transistors or unipolar MOS transistors. The control electrode, the first main electrode and the second main electrode correspond to the base, the emitter and the collector, respectively, for a bipolar transistor and to the gate, the source and the drain, respectively, for a unipolar transistor.

This embodiment may be characterised further in that the first main electrodes of the input transistors and output transistors of the first and the second current mirror are connected to the first supply terminal via resistors, and the first main electrodes of the input transistors and output transistors of the third and the fourth current mirror are connected to the second supply terminal via resistors.

The resistors provide a better matching between the current mirror transistors and improve the temperature stability.

A first embodiment of an arrangement in accordance with the invention with common-mode control is characterised in that the write amplifier further comprises: a first resistor connected between the first write terminal and a first node, a second resistor connected between the first node and the second write terminal, a third resistor connected between the first supply terminal and the first node, and a fourth resistor connected between the second supply terminal and the first node.

The first and the second resistor are arranged in series across the write head and also form damping resistors for the write head. The common-mode voltage across the write head is equal to the voltage on the first node, which forms the centre tap of the first and the second resistor, and is fixed by means of a simple voltage divider arranged across the power supply and comprising the third and the fourth resistor. The fixation of the common-mode voltage improves as the impedance of the voltage divider is reduced. Too low an impedance is to be avoided in view of the increasing dissipation in the voltage divider.

In order to reduce the dissipation a second embodiment of the arrangement with common mode control in accordance with the invention is characterised in that the write amplifier further comprises: a first resistor connected between the first write terminal and a first node, a second resistor connected between the first node and the second write terminal, a first transistor of a first conductivity type having a control electrode, a first main electrode connected to the first node and a second main electrode coupled to the first supply terminal, a second transistor of the first conductivity type having a control electrode connected to the control electrode of the first transistor, a first main electrode, and a second main electrode connected to the control electrode of the second transistor, a third resistor connected between the first supply terminal and the second main electrode of the second transistor, a third transistor of a second conductivity type having a control electrode, a first main electrode connected to the first node and a second main electrode coupled to the second supply terminal, a fourth transistor of the second conductivity type having a control electrode connected to the control electrode of the third transistor, a first main electrode connected to the first main electrode of the second transistor and a second main electrode connected to the control electrode of the fourth transistor, and a fourth resistor connected between the second supply terminal and the second main electrode of the fourth transistor.

The first and the second transistor operate in class A/B and produce at the first node a low impedance, which can be realised with comparatively larger third and fourth resistors.

Only two of the four current mirrors are active at the same time. The turn-on of the current mirrors can be speeded up by allowing quiescent current to flow through the four current mirrors. Then, less current is needed to charge and discharge the stray capacitances in the current mirrors. A third embodiment of an arrangement with common mode control in accordance with the invention is characterised in that the write amplifier further comprises:

a first resistor connected between the first write terminal and a first node, a second resistor connected between the first node and the second write terminal, a third resistor connected between the first write terminal and a second node, a fourth resistor connected between the second node and the second write terminal, a first transistor of a first conductivity type having a control electrode, a first main electrode connected to the first node and a second main electrode coupled to the first supply terminal, a second transistor of the first conductivity type having a control electrode connected to the control electrode of the first transistor, a first main electrode, and a second main electrode connected to the control electrode of the second transistor, a fifth resistor connected between the first supply terminal and the second main electrode of the second transistor, a third transistor of the first conductivity type having a control electrode connected to the control electrode of the first transistor, a first main electrode connected to the first node and a second main electrode coupled to the second supply terminal, a fourth transistor of a second conductivity type having a control electrode, a first main electrode connected to the first node and a second main electrode coupled to one of the third current input terminal and the fourth current input terminal, a fifth transistor of the second conductivity type having a control electrode connected to the control electrode of the fourth transistor, a first main electrode connected to the first main electrode of the second transistor and a second main electrode connected to the control electrode of the fifth transistor, a sixth resistor connected between the second supply terminal and the second main electrode of the fifth transistor, a sixth transistor of the second conductivity type having a control electrode connected to the control electrode of the fourth transistor, a first main electrode connected to the second node and a second main electrode coupled to the other one of the third current input terminal and the fourth current input terminal.

This embodiment advantageously combines the common-mode control and the quiescent current setting for the four current mirrors. Now the bias currents through the four transistors connected to the first and the second node are not drained to the supply terminals but flow into the respective current input terminals of the four current mirrors and serve as quiescent currents for the current mirrors. The damping resistance is made up of two series chains of two resistors having a centre tap at the first and the second node. The current mirrors reduce the apparent resistance of the damping resistors for common-mode signals by a factor determined by the current gain of the current mirrors. The individual series chains function as emitter degeneration resistors for the first and the fourth transistor, whose emitters are connected to the first node, and for the third and the sixth transistor, whose emitters are connected to the second node. This reduces the influence of a possible mismatch between the first and the fourth transistor and between the third and the sixth transistor. An alternative embodiment is characterised in that the second node is connected to the first node.

The afore-mentioned first and second switchable current sources determine how much and in which direction current flows through the write head. In this respect an embodiment of the arrangement in accordance with the invention is characterised in that the first and the second switchable current source comprise: a seventh transistor of a first conductivity type having a control electrode connected to a third node, a first main electrode, and a second main electrode coupled to the first current input terminal, an eighth transistor of the first conductivity type having a control electrode connected to the control electrode of the seventh transistor, a first main electrode, and a second main electrode coupled to the first supply terminal, a ninth transistor of a second conductivity type having a control electrode connected to a fourth node, a first main electrode connected to the first main electrode of the seventh transistor, and a second main electrode coupled to the fourth current input terminal, a diode-connected tenth transistor of the second conductivity type having a first main electrode connected to the first main electrode of the eighth transistor and having a control electrode and second main electrode connected to the fourth node, a bias current source coupled to the fourth node to supply a bias current to the fourth node, an eleventh transistor of the first conductivity type having a control electrode connected to a fifth node, a first main electrode, and a second main electrode coupled to the second current input terminal, a twelfth transistor of the first conductivity type having a control electrode connected to the control electrode of the eleventh transistor, a first main electrode, and a second main electrode coupled to the first supply terminal, and a thirteenth transistor of the second conductivity type having a control electrode connected to the fourth node, a first main electrode connected to the first main electrode of the transistor, and a second main electrode coupled to the third current input terminal.

The bias current source determines the magnitude of the write current through the write head. The bias current is drained to the power supply via the eighth transistor or via the twelfth transistor, depending on the value of the information signal. The seventh, the ninth and the tenth transistor form a translinear loop with the eighth transistor, and the eleventh, the thirteenth and the tenth transistor form a translinear loop with the twelfth transistor. Conduction of the eighth or the twelfth transistor now results in an amplified current flowing from the first current input terminal to the third current input terminal via the seventh and the ninth transistor or from the second current input terminal to the fourth current input terminal. The d.c. level of the information signal at the third and the fifth node, applied via a suitable buffer if required, is fully isolated from the d.c. level at the current input terminals. The switchable current sources thus form floating switchable current sources whose switching signals have d.c. levels which can be chosen freely.

The buffers for the information signal can be emitter followers or source followers. The quiescent current supply for these followers can be combined advantageously with the current supply for the switchable current sources. To this end, an embodiment of the arrangement is further characterised in that the first and the second switchable current source further comprise:

a fourteenth transistor of the first conductivity type having a control electrode for receiving the information signal, a first main electrode connected to the third node and a second main electrode coupled to the first supply terminal, a fifteenth transistor of the first conductivity type having a control electrode for receiving the information signal, a first main electrode connected to the fifth node and a second main electrode coupled to the first supply terminal, a sixteenth transistor of the first conductivity type having a control electrode connected to the control electrode of the eighth transistor, a first main electrode connected to the first main electrode of the eighth transistor, and a second main electrode coupled to the fifth node, a seventeenth transistor of the first conductivity type having a control electrode connected to the control electrode of the twelfth transistor, a first main electrode connected to the first main electrode of the twelfth transistor, and a second main electrode coupled to the third node, the second main electrode of the eighth transistor being connected to the third node and the second main electrode of the twelfth transistor being connected to the fifth node.

The fourteenth and the fifteenth transistor operate as signal followers and buffer the information signal. The current through these transistors now flows to the fourth node through the eighth and the twelfth transistor, respectively. The sixteenth and the seventeenth transistor ensure that always one half of the bias current from the bias current source flows through one signal follower and the other half through the other signal follower.

The current switching means may also be devised in another manner, for example as known from the aforementioned U.S. Pat. No. 5,282,094, FIG. 1. To this end an embodiment of an arrangement in accordance with the invention is characterised in that the current-switching means comprise:

a differential pair comprising a first differential-pair transistor of a first conductivity type and a second differential-pair transistor of the first conductivity type, whose first main electrodes are coupled to receive a bias current from a bias current source, whose control electrodes are connected to receive the information signal and whose second main electrodes are coupled to the first current input terminal and the second current input terminal, respectively; a first current sensor resistor connected between the second supply terminal and a further second current output terminal of the second current mirror, and a second current sensor resistor connected between the second supply terminal and a further first current output terminal of the first current mirror; a first pull-down transistor of the first conductivity type having a control electrode and first main electrode connected to the first current sensor resistor and a second main electrode coupled to the first current output terminal, and a second pull-down transistor of the first conductivity type having a control electrode and first main electrode connected to the second current sensor resistor and a second main electrode coupled to the second current output terminal.

The activation of one of the current mirrors is detected by a current through one of the current sensor resistors. The voltage across the relevant current sensor resistor turns on the associated pull-down transistor, which in its turn connects one of the write terminals to the negative supply terminal.

The two current mirrors may be of any suitable type. In order to obtain a maximal output swing of the write amplifier a preferred embodiment of the arrangement in accordance with the invention is characterised in that the first current mirror and the second current mirror each comprise a diode-connected input transistor of a second conductivity type having a control electrode and second main electrode connected to the first and the second current input terminal, respectively, and a second main electrode coupled to the first supply terminal, an output transistor of the second conductivity type having a control electrode connected to the control electrode of the respective input transistor, a first main electrode coupled to the first supply terminal, and a second main electrode connected to the first and the second current output terminal, respectively, and a further output transistor of the second conductivity type having a control electrode connected to the control electrode of the relevant input transistor, a first main electrode coupled to the first supply terminal, and a second main electrode connected to the further first and second current output terminal, respectively.

Current mirrors thus implemented produce a minimal voltage loss and allow an output swing up to nearly the supply voltage.

In addition to the capacitive feed-forward current compensation technique, a feed-back neutrodyne compensation may be used to compensate for the adverse effect of the parasitic capacitances. For this purpose an embodiment of the arrangement according to the invention is characterised in that the write amplifier comprises at least one of two capacitors, of which a first capacitor is connected between the first current input terminal and the second current output terminal, and a second capacitor is connected between the second current input terminal and the first current output terminal.

The first and second capacitors neutralise the parasitic capacitances by injecting opposite capacitive currents into the first and second write terminal via the first and second current mirror. For an optimum effect the capacitors are preferable used in pairs, i.e. the first together with the second, in order not to disturb the symmetry of the arrangement.

If desired, the third and fourth current mirror may also be used for neutralising the parasitic capacitances, for which purpose the arrangement in accordance to the invention is further characterised in that the write amplifier comprises at least one of two further capacitors, of which a third capacitor is connected between the third current input terminal and the fourth current output terminal, and a fourth capacitor is connected between the fourth current input terminal and the third current output terminal.

BRIEF DESCRIPTION OF THE DRAWINGS

These and other aspects of the invention will be described and elucidated with reference to the accompanying drawings, in which.

In these Figures like elements bear the same reference symbols.

DETAILED DESCRIPTION OF THE PREFERRED EMBODIMENTS OF THE INVENTION

Figure 1:
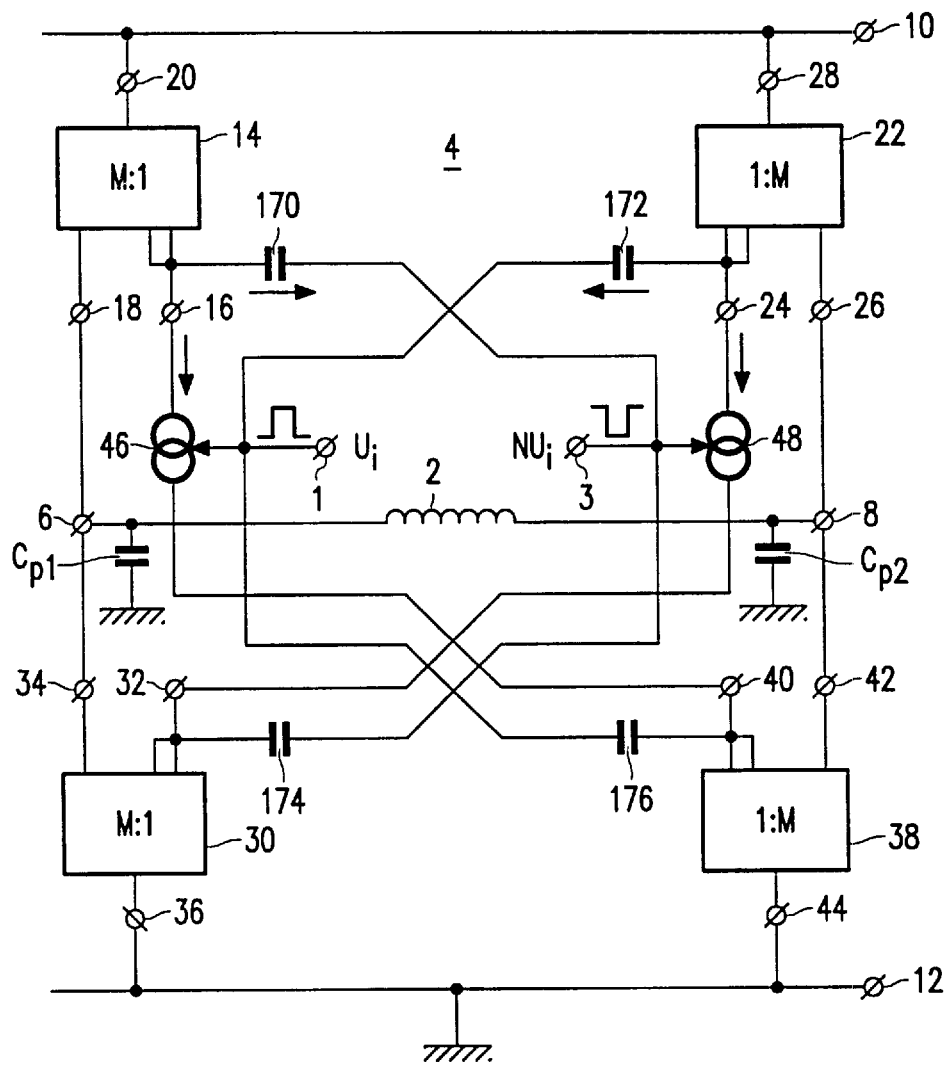
FIG. 1 shows a block diagram of an embodiment of an arrangement for recording an information signal on a magnetic record carrier in accordance with the invention.

FIG. 1 shows the basic structure of an arrangement for recording an information signal on a magnetic record carrier in accordance with the invention. The arrangement comprises a write head 2 for recording information on the record carrier (not shown) and a write amplifier 4 for driving the write head 2 in response to the information signal, which is present at a first signal terminal 1 and a second signal terminal 3. The write amplifier has a first write terminal 6 and a second write terminal 8, which are coupled to the write head 2 to supply a write current. A first supply terminal 10 and a second supply terminal 12 serve for connection of a supply voltage for the write amplifier. In the present case the second supply terminal 12 is connected to signal earth. The amplifier 4 comprises a first current mirror 14 having a first current input terminal 16, a first current output terminal 18 coupled to the first write terminal 6, and a first common current terminal 20 connected to the first supply terminal 10; a second current mirror 22 having a second current input terminal 24, a second current output terminal 26 coupled to the second write terminal 8, and a second common current terminal 28 connected to the first supply terminal 10; a third current mirror 30 having a third current input terminal 32, a third current output terminal 34 coupled to the first write terminal 6, and a third common current terminal 36 connected to the second supply terminal 12; a fourth current mirror 38 having a fourth current input terminal 40, a fourth current output terminal 42 coupled to the second write terminal 8, and a fourth common current terminal 44 connected to the second supply terminal 12. A first switchable current source 46 is connected between the first current input terminal 16 and the fourth current input terminal 40. The first switchable current source 46 supplies a first current for a first value of the information signal $U_i$ at signal terminal 1 and is currentless for a second value of the information signal $U_i$. The information signal $U_i$ may be, for example, the binary data signal for a disk drive or another magnetic storage medium. A second switchable current source 48 is connected between the second current input terminal 24 and the third current input terminal 32. The second switchable current source 48 receives an inverse information signal $NU_i$ at the second signal terminal 3 and supplies a second current if the first current is zero and the other way around.

When the first switchable current source 46 is turned on current will flow from the first supply terminal 10 to the second supply terminal 12 through the first current input terminal 16 of the first current mirror 14 and through the fourth current input terminal 40 of the fourth current mirror 38. A current which is M times as large flows in the same direction from the first current output terminal 18 of the first current mirror 14 to the fourth current output terminal 42 of the fourth current mirror 38 via the first write terminal 6, the write head 2 and the second write terminal 8. Here, M is the current mirror ratio of the current mirrors 14, 22, 30 and 38. The second switchable current source 48 is turned off, so that the second current mirror 22 and the third current mirror 30 are inoperative. Now a write current flows from the first write terminal 6 to the second write terminal 8 through the write head 2.

When the first switchable current source 46 is turned off and the second switchable current source 48 is turned on the second current mirror 22 and the third current mirror 30 are active and the other two current mirrors 14 and 38 are inactive. Now a write current flows in the opposite direction from the second write terminal 8 to the first write terminal 6 through the write head 2. It will be obvious that the first current of the first switchable current source 46 and the second current of the second switchable current source 48 should be equal in order to obtain equal write currents in both directions in the case that the current mirror ratios of the current mirrors are all equal.

Figure 2:
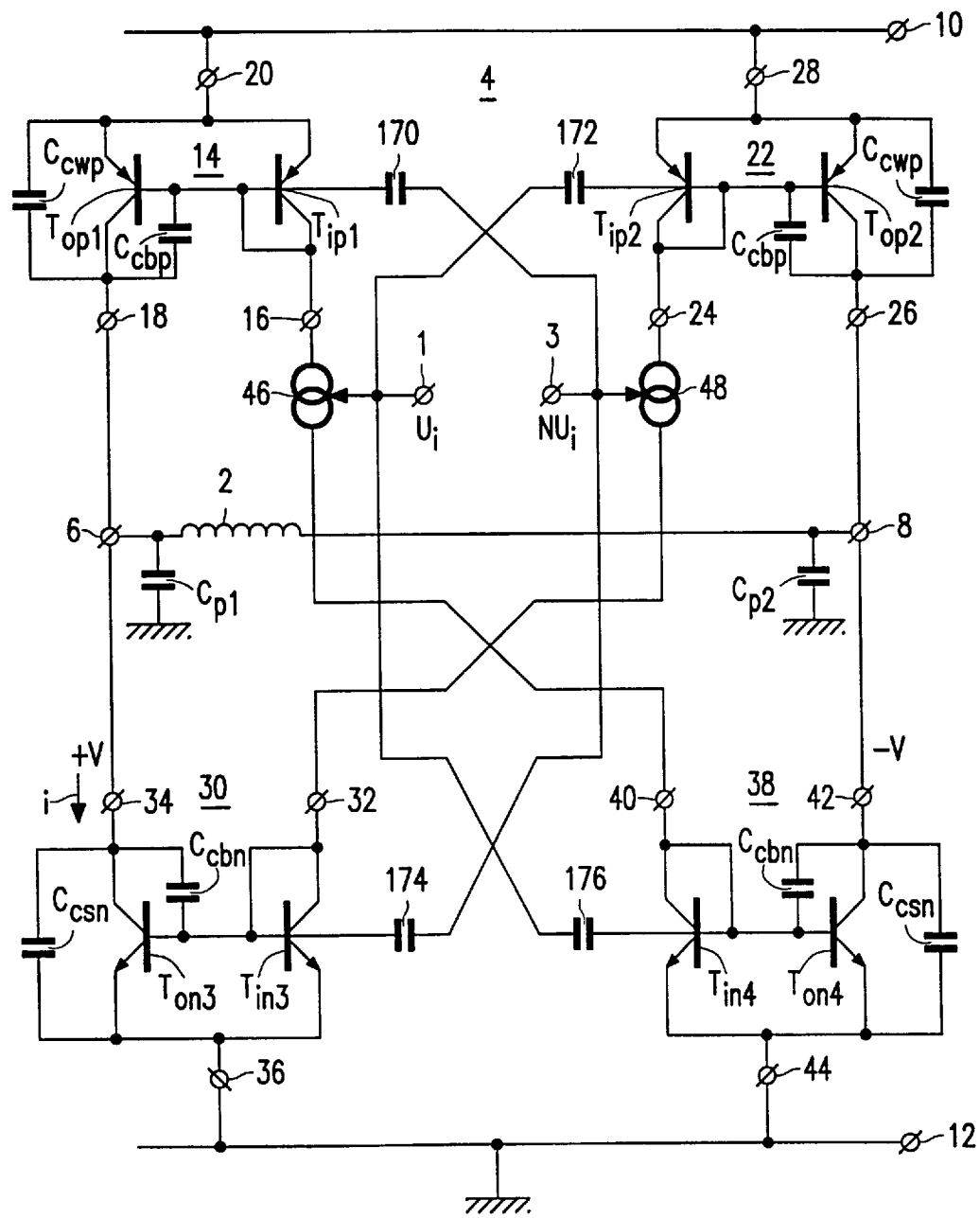
FIG. 2 is a circuit diagram of the arrangement in FIG. 1.
Figure 3:
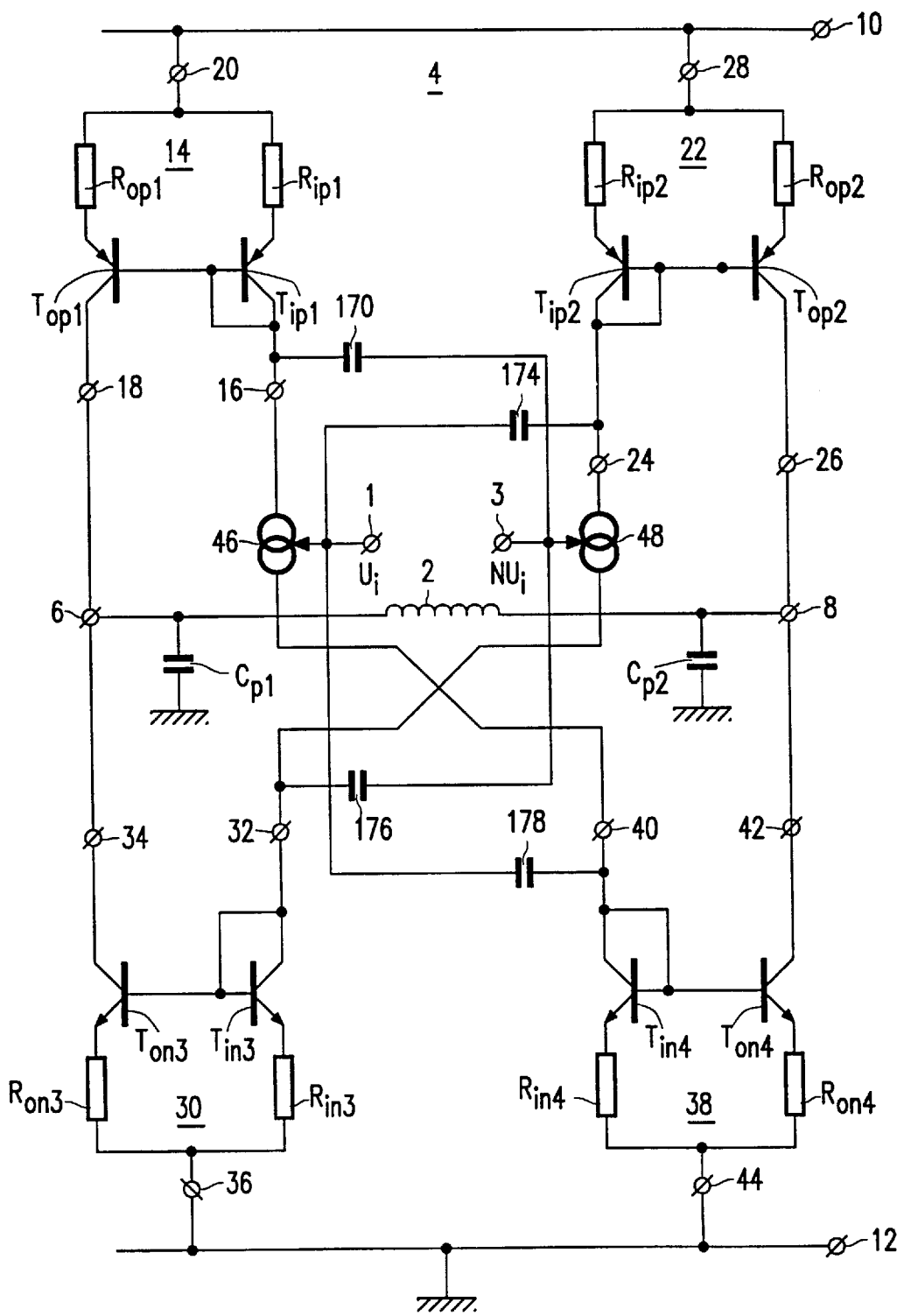
FIG. 3 is another circuit diagram of the arrangement in FIG. 1.

FIG. 2 shows a circuit embodiment of FIG. 1 in which the first current mirror 14 and the second current mirror 22 comprise bipolar PNP transistors and the third current mirror 30 and the fourth current mirror 38 comprise bipolar NPN transistors. However, it is to be noted that in the circuit arrangements disclosed and to be disclosed bipolar transistors may be replaced wholly or partly by unipolar MOS transistors. The control electrode, the first main electrode and the second main electrode correspond to the base, the emitter and the collector, respectively, for a bipolar transistor and to the gate, the source and the drain, respectively, for a unipolar transistor. The first current mirror 14 comprises a diode-connected PNP input transistor $T_{ip1}$, having its emitter connected to the first common current terminal 20 via an optional emitter resistor $R_{ip1}$, as shown in FIG. 3, and its collector to the first current input terminal 16, and a PNP output transistor $T_{op1}$, having its base connected to the base of the input transistor $T_{ip1}$, its emitter to the first common current terminal 20 via an optional emitter resistor $R_{op1}$, as shown in FIG. 3, and its collector to the first current output terminal 18. The optional emitter resistors improve the matching of the transistors and increase the thermal stability of the current mirror. The second current mirror 22 likewise comprises PNP transistors and the third current mirror 30 and the fourth current mirror 38 likewise comprise NPN transistors and optional emitter resistors, the electrodes of the respective transistors being connected to the corresponding terminals of the current mirrors.

FIG. 2 further shows a number of parasitic capacitances, i.e. one having a value $C_{cwp}$ between collector and well of the PNP output transistors $T_{op1}$ and $T_{op2}$, one having a value $C_{csn}$ between collector and substrate of the NPN output transistors $T_{on3}$ and $T_{on4}$, one having a value $C_{cbp}$ between collector and base of the PNP output transistors $T_{op1}$ and $T_{op2}$, and one having a value $C_{cbn}$ between collector and base of the NPN output transistors $T_{on3}$ and $T_{on4}$. Also, a parasitic capacitance $C_{p1}$ is present at the first write terminal 6 and a parasitic capacitance $C_{p2}$ at the second write terminal 8. All these parasitic capacitances have an effect on the write current through the write terminals 6 and 8. The effect is that at high frequencies the write current flows through the parasitic capacitances instead of through the write head. This effect limits the bit rate of the write current.

In order to reduce or even eliminate the adverse effect of the parasitic capacitances, a first capacitive feed-forward capacitor 170 is inserted between the second signal terminal 3 and the first current input terminal 16, a second feed-forward capacitor 172 is inserted between the second current input terminal 24 and the first signal terminal 1, a third feed-forward capacitor 174 is inserted between the third current input terminal 32 and the second signal terminal 3 and a fourth feed-forward capacitor 176 is inserted between the fourth current input terminal 40 and the first signal terminal 1. During transitions in the information signal capacitive charge is fed forward from the signal terminals 1 and 3 to the current input terminals 16, 24, 32 and 40, multiplied and added to the total current flowing to the write terminals 6 and 8. The extra capacitive currents compensate the parasitic currents flowing into the capacitive capacitances and improve the slew rate of the current through the write head 2. The compensation is based on a feed-forward system which is unconditionally stable, even if overcompensation is applied. This only results in more overshooting, but not in instability, contrary to feed-back compensation systems which are susceptible of oscillations if too much compensation is applied.

When the information signal at the first signal terminal 1 goes high, the first switchable current source 46 enables a current flow from the first current input terminal 16 to the fourth current input terminal 40. A M-times multiplied current flows from the first write terminal 6 via the head 2 to the second write terminal 8. The reverse signal transition at the second signal terminal 3 causes a capacitive current flow in the current input terminal 16 via the first feed-forward capacitor 170, which capacitive current has the same direction as the current caused by the first current switch 46. A similar effect occurs at the other three current input terminals 24, 32 and 40. The compensating capacitive currents thus have the same direction as the capacitive currents flowing through, for instance, the parasitic capacitances $C_{p1}$ and $C_{p2}$ at the first and second write terminals 6 and 8.

It will be obvious that the compensating effect is already obtained with one feed-forward capacitor. However, in order to maintain the symmetry of the arrangement and to avoid unnecessary loading of a common-mode control circuit, it is preferred to use the feed-forward capacitors in two pairs.

It is further noted that in the Figures, by way of example, the switchable current source 46 is switched on if the signal $U_i$ at signal terminal 1 is relatively high and is switched off if the signal $U_i$ is relatively low. It is clear that a switchable current source requiring an inverted input signal can also be used for this purpose. The same holds for the second switchable current source 48. In that case the first and third feed-forward capacitors 170 and 174 should be connected to the first signal terminal 1 and the second and fourth feed-forward capacitors 172 and 176 to the second signal terminal 3.

The common-mode voltage of the write head 2 is completely indeterminate and may fluctuate with the data pattern of the information signal to be recorded. This is undesirable. The common-mode voltage should preferably lie halfway between the available output swing and should be independent of the signal content of the signal to be recorded. Since the write head 2 is arranged exclusively between high-impedance outputs of current mirrors it is possible to stabilize the common-mode voltage with a common-mode circuit.

Figure 4:
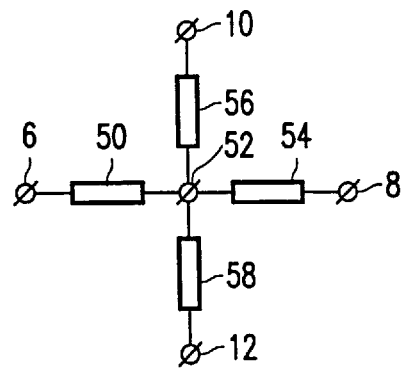
FIG. 4 shows a first common-mode circuit for use in an arrangement in accordance with the invention.

FIG. 4 shows a simple common-mode circuit. A series arrangement of a first resistor 50 connected between the first write terminal 6 and a first node 52, a second resistor 54 connected between the first node 52 and the second write terminal 8, a third resistor 56 connected between the first supply terminal 10 and the first node 52, and a fourth resistor 58 connected between the second supply terminal 12 and the first node 52 is arranged in parallel with the write head. The resistors 50 and 52 also function as damping resistors for the write head. The impedance at the first node 52 is dictated by the resistors 56 and 58. For a correct fixation of the common-mode voltage a minimal impedance is desired. However, the resistance value of the resistors 56 and 58 cannot be chosen arbitrarily small on account of the increasing current through these resistors.

Figure 5:
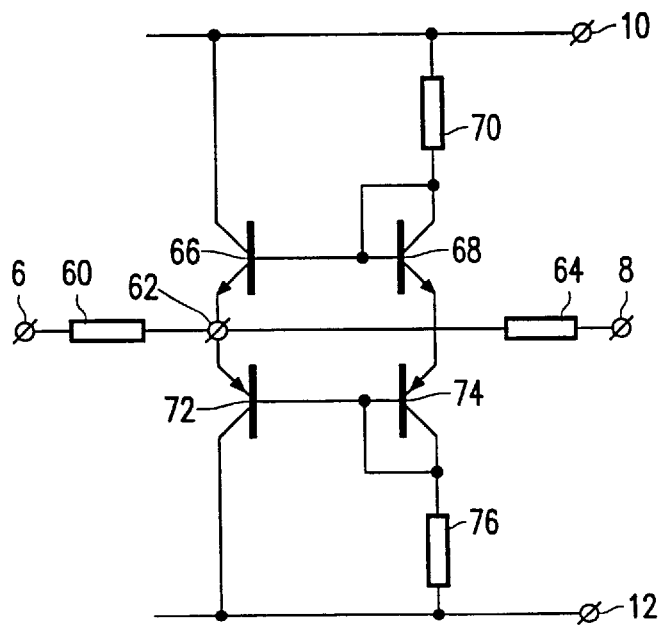
FIG. 5 shows a second common-mode circuit for use in an arrangement in accordance with the invention.

FIG. 5 shows a common-mode circuit which mitigates this problem. The circuit again comprises a first resistor 60 connected between the first write terminal 6 and a first node 62, and a second resistor 64 connected between the first node 62 and the second write terminal 8 and, in addition, it comprises a first NPN transistor 66 having its emitter connected to the first node 62 and having its collector coupled to the first supply terminal 10, a diode-connected second NPN transistor 68 having its base connected to the base of the first NPN transistor 66, a third resistor 70 connected between the first supply terminal 10 and the collector of the second NPN transistor 68, a first PNP transistor 72 having its emitter connected to the first node 62 and having its collector coupled to the second supply terminal 12, a diode-connected second PNP transistor 74 having its base connected to the base of the first PNP transistor 72 and having its emitter connected to the emitter of the second PNP transistor 68, and a fourth resistor 76 connected between the second supply terminal 12 and the collector of the second PNP transistor 74.

The circuit operates in class A/B. Seen at the first node 62, the impedance is low, which provides a correct fixation of the common-mode voltage. The class A/B operation enables a small quiescent current to be obtained in and a large maximum current to be supplied by the first NPN transistor 66 or the first PNP transistor 72. The effective common-mode resistance is equal to Rd/4, the resistance value of both the resistor 60 and the resistor 64 being equal to Rd/2. The overall damping resistance across the write head 2 is consequently Rd.

Figure 6:
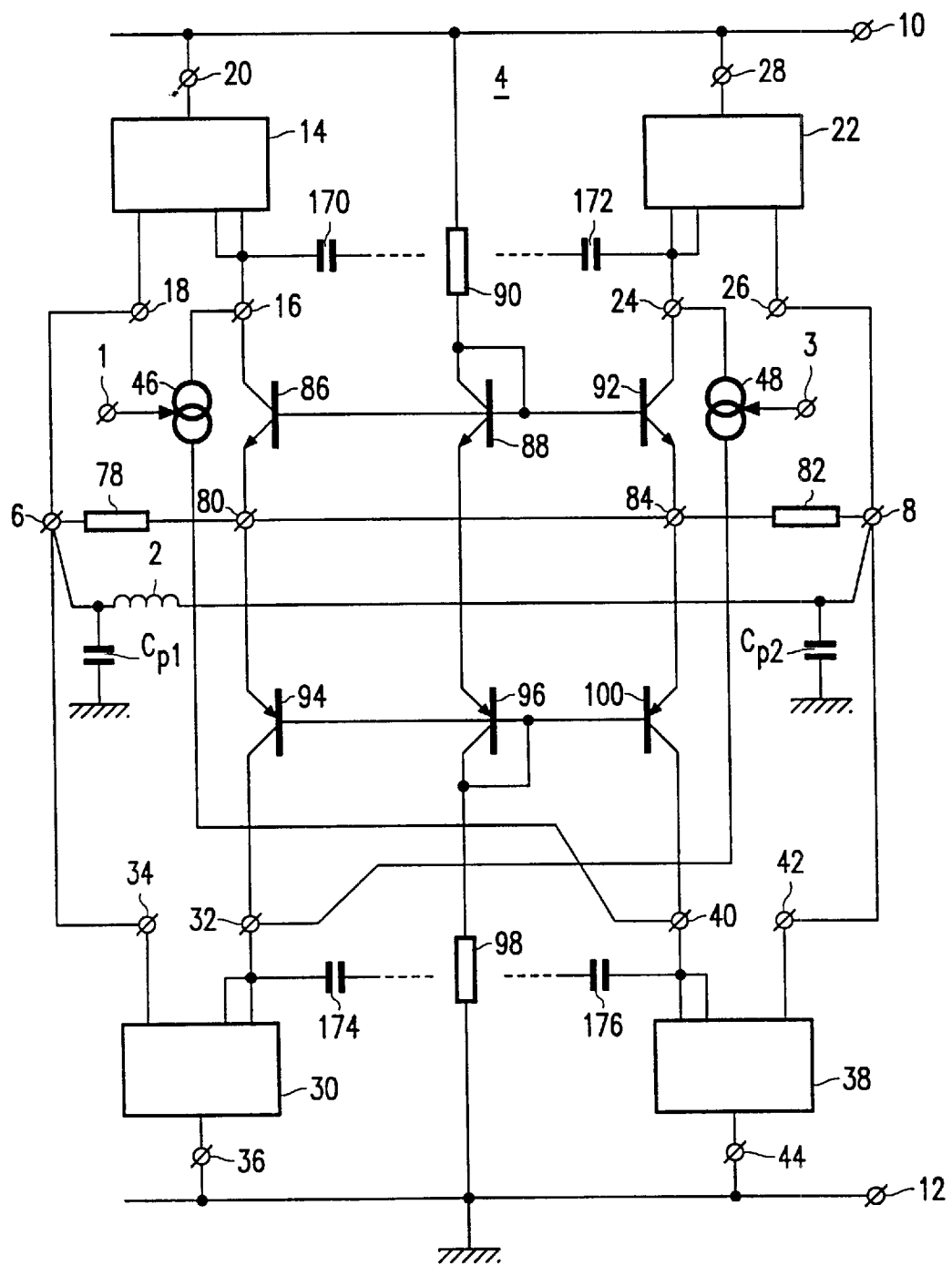
FIG. 6 shows a circuit diagram of an embodiment of an arrangement for recording an information signal on a magnetic record carrier in accordance with the invention, including a third common-mode circuit.

In order to step up the switching speed of the current mirrors in the arrangements shown in FIGS. 1 and 2 it is desirable to have a quiescent current in the current mirrors. This quiescent current setting and the common-mode circuit can be combined advantageously. FIG. 6 shows an embodiment in which this is implemented. The write amplifier 4 again comprises four current mirrors 14, 22, 30 and 38, the write head 2, the first switchable current source 46 and the second switchable current source 48 as shown in FIG. 1. The common-mode circuit comprises a first resistor 78 connected between the first write terminal 6 and a first node 80, a second resistor 82 between a second node 84 and the second write terminal 8, a first transistor 86 of the NPN type having its emitter connected to the first node 80 and having its collector coupled to the first current input terminal 16, a diode-connected second transistor 88 of the NPN type having its base connected to the base of the first transistor 86, a third resistor 90 connected between the first supply terminal 10 and the collector of the second transistor 88, and a third transistor 92 of the NPN type having its base connected to the base of the first transistor 86 and its emitter to the second node 84 and having its collector coupled to the second current input terminal 24. The common-mode circuit further comprises a fourth transistor 94 of the PNP type having its emitter connected to the first node 80 and having its collector coupled to the third current input terminal 32, a diode-connected fifth transistor 96 of the PNP type having its base connected to the base of the fourth transistor 94 and having its emitter connected to the emitter of the second transistor 88, a fourth resistor 98 connected between the second supply terminal 12 and the collector of the fifth transistor 96, and a sixth transistor 100 of the PNP type having its base connected to the base of the fourth transistor 94 and its emitter to the second node 84 and having its collector coupled to the fourth current input terminal 40. The first node 80 and the second node 84 are interconnected. The quiescent current which flows through the transistors 86 and 94 now also flows into the first current input terminal 16 of the first current mirror 14 and into the third current input terminal 32 of the third current mirror 30. The quiescent current setting for the second current mirror 22 and the fourth current mirror 38 is obtained in a similar way by means of the transistors 92 and 100. The effective common-mode resistance is equal to Rd/(4(M+1)), where Rd/2 is the resistance value of the first resistor 78 and of the second resistor 82 and M is the current mirror ratio of the current mirrors 14, 22, 30 and 38. A voltage variation at the write terminal 6 produces in the first resistor 78 a current which appears M times as large at the same write terminal 6. The apparent resistance value Rd/2 of the first resistor 78 is thus reduced by a factor (M+1). The same occurs for the second resistor 82. It is to be noted that the collector of the transistor 94 may be coupled to the fourth current input terminal 40 instead of to the third current input terminal 32 and that the collector of the transistor 100 may be coupled to the third current input terminal 32 instead of to the fourth current input terminal 40. This makes no difference for the quiescent current setting because the current in the transistors 94 and 100 is the same. If desired, instead of the transistors 94 and 100, the collectors of the transistors 86 and 92 may be connected crosswise to the current input terminal 16 and 24.

Figure 7:
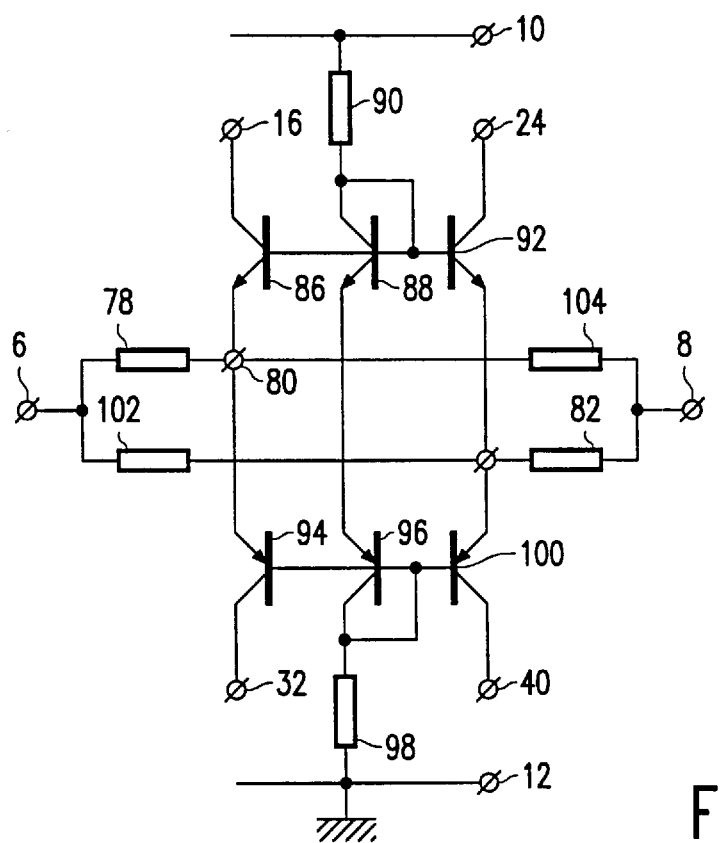
FIG. 7 shows a fourth common-mode circuit for use in an arrangement in accordance with the invention.

FIG. 7 shows an alternative solution, in which the connection between the first node 80 and the second node 84 shown in FIG. 6 is severed. Instead of this, a fifth resistor 102 is now connected between the write terminal 6 and the second node 84 and a sixth resistor 104 between the first node 80 and the write terminal 8. This solution can be more accurate because the transistors 86 and 92 as well as the transistors 94 and 100 now each see a separate degeneration resistor in series with their emitters. This mitigates the effect of a possible mismatch between the transistors 86 and 92 and between the transistors 94 and 100. Again, it is to be noted that the collector of the transistor 94 may be coupled to the fourth current input terminal 40 instead of to the third current input terminal 32 and that the collector of the transistor 100 may be coupled to the third current input terminal 32 instead of to the fourth current input terminal 40.

Figure 8:
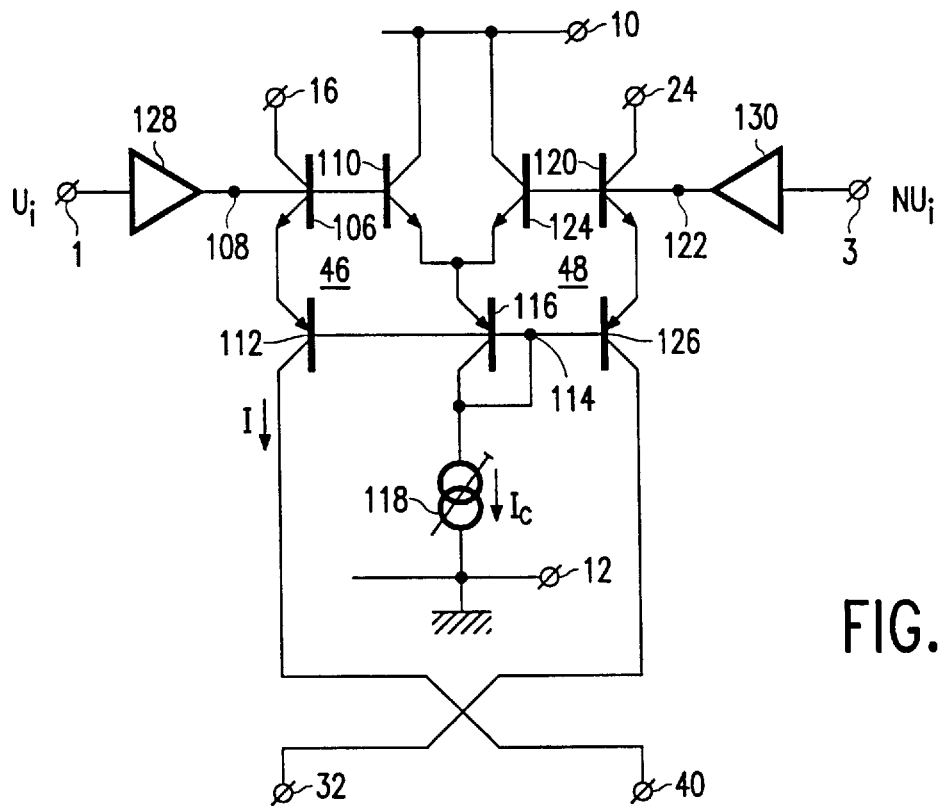
FIG. 8 shows a first implementation of switched current sources for use in an arrangement in accordance with the invention.

FIG. 8 shows a circuit diagram of an implementation of the first switchable current source 46 and the second switchable current source 48 of the arrangements shown in FIGS. 1, 2 and 5. The two switchable current sources are united in one circuit comprising the following elements. An NPN transistor 106 having its base connected to a third node 108 and having its collector coupled to the first current input terminal 16, an NPN transistor 110 having its base connected to the base of the transistor 106 and having its collector coupled to the first supply terminal 10, a PNP transistor 112 having its base connected to a fourth node 114 and its emitter to the emitter of the transistor 106 and having its collector coupled to the fourth current input terminal 40, a diode-connected PNP transistor 116 having its emitter connected to the emitter of the transistor 110 and having its base and its collector connected to the fourth node 114, a bias current source 118 coupled to the fourth node 114 to supply a bias current $I_c$ to the fourth node 114. The circuit further comprises an NPN transistor 120 having its base connected to a fifth node 122 and having its collector coupled to the second current input terminal 24, an NPN transistor 124 having its base connected to the base of the transistor 120 and having its collector coupled to the first supply terminal 10, and a PNP transistor 126 having its base connected to the fourth node 114 and its emitter to the emitter of the transistor 120 and having its collector coupled to the third current input terminal 32.

The nodes 108 and 122 are driven in phase opposition with the information signal $U_i$ and the inverse information signal $NU_i$ via buffers 128 and 130. When the voltage at the node 108 is high and the voltage at the node 122 is low the transistor 110 is conductive and the transistor 124 is cut off. The bias current $I_c$ of the bias current source 118 flows wholly through the transistor 110 via the transistor 116. The base-emitter junctions of the transistors 106, 110, 116 and 112 form a translinear loop, the sum of the base-emitter voltages of the transistors 106 and 112 being equal to the sum of the base-emitter voltages of the transistors 110 and 116. By means of the well-known formula for the relationship between the collector current and the base-emitter voltage of a transistor it is then possible to derive that the current I through the transistors 106 and 112 is equal to I=SQRT (M * N) * $I_c$, where SQRT is the root function, M the ratio between the emitter areas of the transistors 106 and 110 and N the ratio between the emitter areas of the transistors 112 and 116. As a result of this, a current I will flow between the terminals 16 and 40, whose magnitude is proportional to the current $I_c$, the proportionality factor being determined by the geometries of the transistors 106, 110, 112 and 116.

Likewise, a current will flow between the second current input terminal 24 and the third current input terminal 32 if the voltage at the node 122 is high and that at the node 108 is low. To this end, the bias current source 118 is preferably an adjustable or programmable current source, for example an IDAC (digital-to-analog converter with current output). Since the current input terminals 16, 24, 32 and 40 are all coupled to collectors the d.c. level of the information signals $U_i$ and $NU_i$ is now isolated from the d.c. levels of the current input terminals of the current mirrors of the write amplifier. Thus, the switched current sources 46 and 48 are floating relative to the supply voltages at the first supply terminal 10 and the second supply terminal 12.

Figure 9:
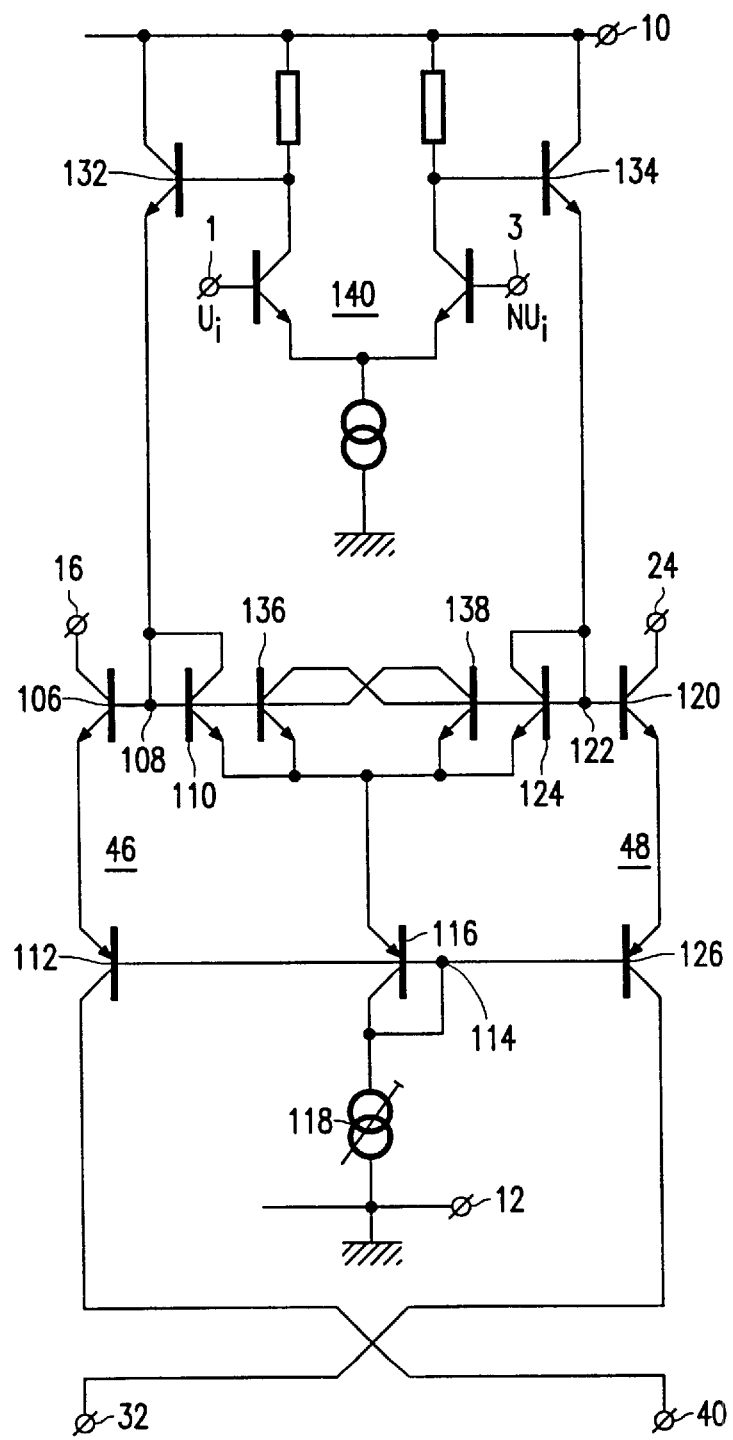
FIG. 9 shows a second implementation of switched current sources for use in an arrangement in accordance with the invention.

The buffers 128 and 130 may comprise emitter-followers with emitter current sources. However, saving current is possible by using the currents through the transistors 110 and 124 for this purpose. FIG. 9 shows how this can be realised. The buffer 128 is now an NPN emitter-follower 132 whose base receives an amplified information signal, whose emitter is connected to the third node 108 and whose collector is coupled to the first supply terminal 10. The collector of the transistor 110 is connected to the emitter of the emitter-follower 132. The buffer 130 likewise comprises an NPN emitter-follower 134 whose base receives an amplified inverse information signal, whose emitter is connected to the fifth node 122 and whose collector is coupled to the first supply terminal 10. The collector of the transistor 124 is connected to the emitter of the emitter-follower 134. The collector currents of the transistors 110 and 124 consequently also flow through the emitter-followers 132 and 134, respectively. Furthermore, there is provided an NPN transistor 136 having its base connected to the base of the transistor 110 and its emitter to the emitter of the transistor 110 and having its collector coupled to the fifth node 122, and an NPN transistor 138 having its base connected to the base of the transistor 124 and its emitter to the emitter of the transistor 124 and having its collector coupled to the third node 108. The transistors 136 and 138 ensure that the currents through the emitter-followers 132 and 134 cannot become zero if one of the transistors 110 and 124 is cut off. Thus, each of the two emitter-followers always receives half the bias current $I_c$ if the geometries of the transistors 110, 136, 138 and 124 are selected to be equal.

The bases of the emitter-followers 132 and 134 are driven, by way of example, by the transistors of a differential pair 140 whose bases are arranged to receive the complementary information signals $U_i$ and $NU_i$, which are supplied, for example, by a data flip-flop.

Figure 10:
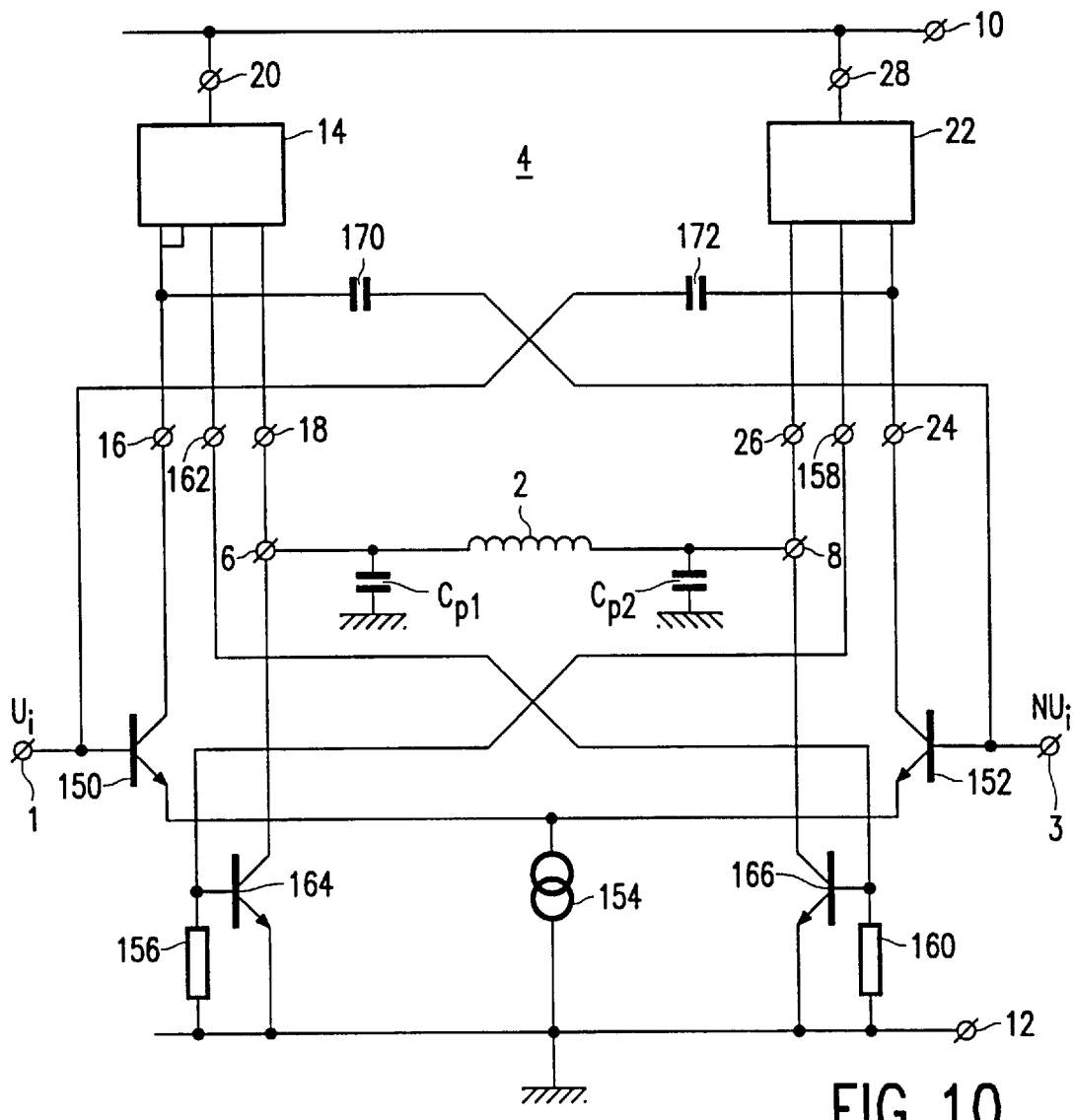
FIG. 10 shows a circuit diagram of another embodiment of an arrangement for recording an information signal on a magnetic record carrier in accordance with the invention.

FIG. 10 shows another embodiment of an arrangement in accordance with the invention in which the parasitic capacitances are neutralised in a manner similar to that in the embodiments described hereinbefore. The arrangement comprises a write head 2 for recording information on the record carrier (not shown) and a write amplifier 4 for driving the write head 2 in response to the information signal. The write amplifier has a first write terminal 6 and a second write terminal 8, which terminals are coupled to the write head 2 to supply a write current. A first supply terminal 10 and a second supply terminal 12 serve to receive a supply voltage for the write amplifier. In the present case the second write terminal 12 is connected to signal earth. The amplifier 4 comprises a first current mirror 14 having a first current input terminal 16, a first current output terminal 18 coupled to the first write terminal 6, and a first common current terminal 20 connected to the first supply terminal 10; a second current mirror 22 having a second current input terminal 24, a second current output terminal 26 coupled to the second write terminal 8, and a second common current terminal 28 connected to the first supply terminal 10. A feed-forward capacitor 170 is connected between the first current input terminal 16 and the second signal terminal 3 and a second feed-forward capacitor 172 is connected between the second current input terminal 24 and the first signal terminal 1 in a fashion similar to FIG. 1. The function and operation of the first current mirror 14 and the second current mirror 22 and of the first feed-forward capacitor 170 and the second feed-forward capacitor 172 is comparable with those of the arrangements in FIGS. 1 and 2. The arrangement further comprises a differential pair with a first NPN differential pair transistor 150 and a second NPN differential pair transistor 152, whose emitters are interconnected and receive a bias current from a bias current source 154. The bases are connected to receive the information signal $U_i$ and $NU_i$ and the collectors are coupled to the first current input terminal 16 and the second current input terminal 24, respectively. A first current sensor resistor 156 is connected between the second supply terminal 12 and a further second current output terminal 158 of the second current mirror 22, and a second current sensor resistor 160 is connected between the second supply terminal 12 and a further first current output terminal 162 of the first current mirror 14. Furthermore, a first NPN pull-down transistor 164 has its base and emitter connected to the first current sensor resistor 156 and has its collector coupled to the first current output terminal 18, and a second NPN pull-down transistor 166 has its base and emitter connected to the second current sensor resistor 160 and has its collector coupled to the second current output terminal 26.

The differential pair transfers the bias current of the bias current source 154 to the first current input terminal 16 or to the second current input terminal 24. If the first current mirror 14 receives current the second pull-down transistor 166 is turned on, as a result of which the write terminal 8 is interconnected to the second supply terminal 12 and the current can flow from the first current output terminal 18 to the second supply terminal 12 via the write head 2. If the second current mirror 22 receives current this results in a current through the write head 2 in the opposite direction.

Figure 11:
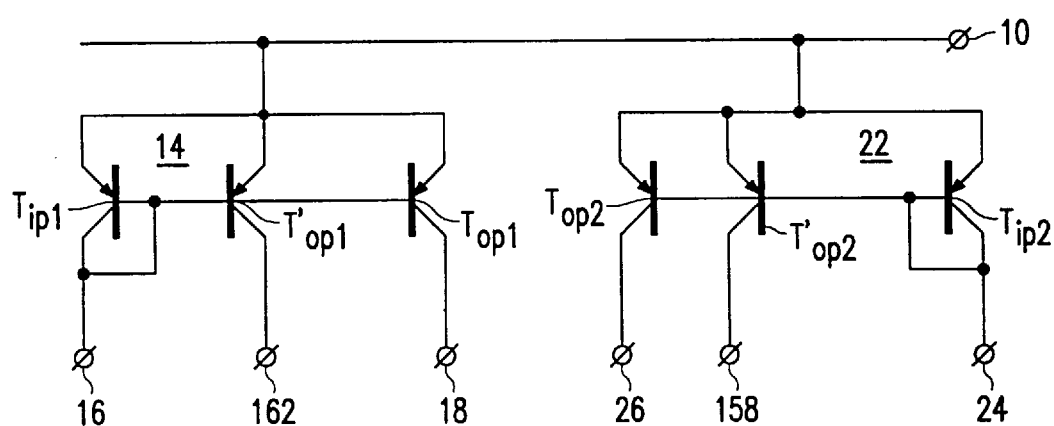
FIG. 11 shows current mirrors for use in the arrangement shown in FIG. 10.

FIG. 11 shows current mirrors for use in the arrangement shown in FIG. 10. The first current mirror 14 and the second current mirror 22 each comprise a diode-connected PNP input transistor $T_{ip}$ having its base and collector connected to the first 16 and the second 24 current input terminal, respectively, and having its collector coupled to the first supply terminal 10, a PNP output transistor $T_{op}$ having its base connected to the base of the respective input transistor $T_{ip}$, having its emitter coupled to the first supply terminal 10 and its collector connected to the first 18 and the second 26 current output terminal, respectively, and a further PNP output transistor $T'_{op}$ having its base connected to the base of the relevant input transistor $T_{ip}$, its emitter coupled to the first supply terminal 10, and its collector connected to the further first 162 and second 158 current output terminal, respectively. If desired, series resistors may be arranged in series with the emitters.

If desired, the bipolar transistors in the examples shown herein may be replaced by unipolar transistors, for example MOS transistors. In that case base, emitter and collector should read gate, source and drain.

Figure 12:
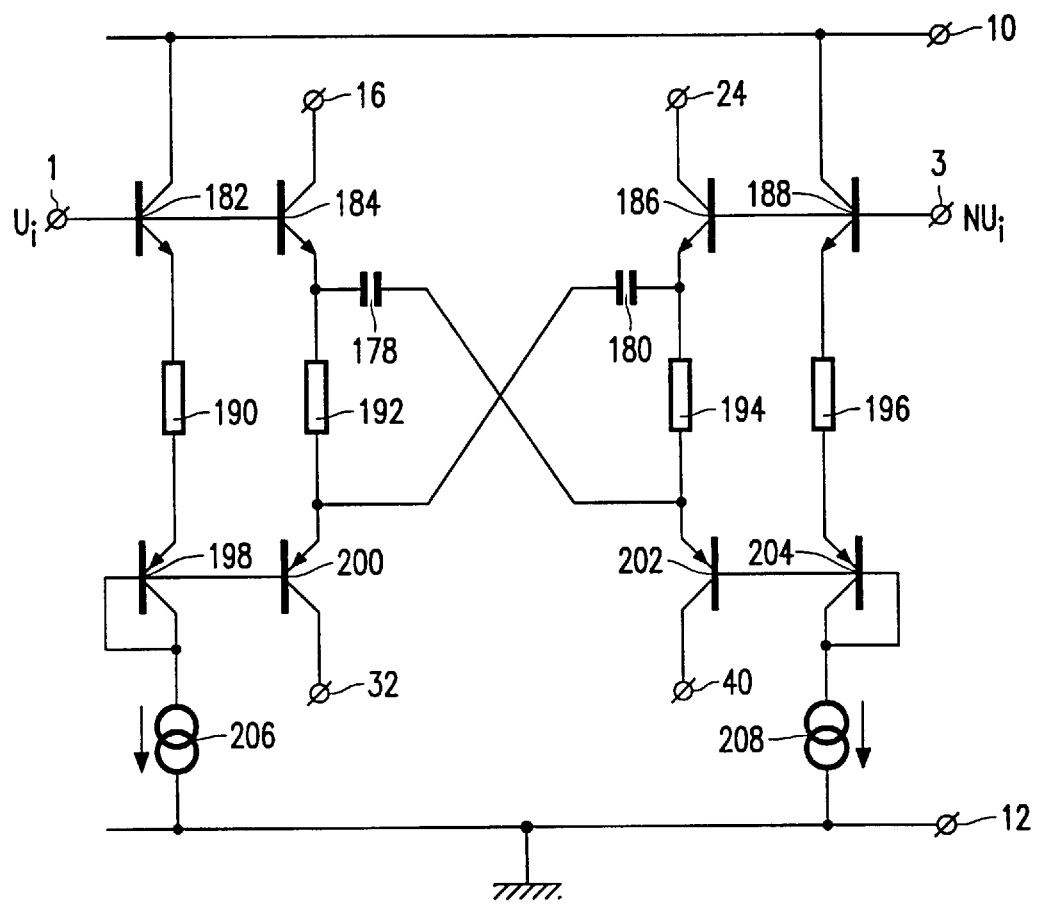
FIG. 12 shows a balanced capacitive feed-forward circuit for use in an arrangement according to the invention.

FIG. 12 shows a bipolar circuit implementation of the feed-forward technique which can be used in the embodiments employing four current mirrors. The bases of two NPN transistors 182 and 184 are coupled to the first signal terminal 1 and receive the information signal $U_i$. The bases of two further NPN transistors 186 and 188 are coupled to the second signal terminal 3 and receive the inverse information signal $NU_i$. The bases of two PNP transistors 198 and 200 and the collector of the PNP transistor 198 are interconnected and coupled to the negative supply terminal 12 via a first bias current source 206. Likewise, the bases of two further PNP transistors 202 and 204 and the collector of the PNP transistor 202 are interconnected and coupled to the negative supply terminal 12 via a second bias current source 208, which provides a bias current substantially equal to the bias current of the first bias current source 206. The emitters of the transistors 182/198, 184/200, 186/202, and 188/204 are interconnected by means of resistors 190, 192, 194 and 196, respectively. A first feed-forward capacitor 178 is connected between the emitter of transistor 178 and the emitter of transistor 202. Likewise, a second feed-forward capacitor is connected between the emitter of transistor 186 and the emitter of transistor 200. The collectors of the transistors 182 and 188 are coupled to the positive supply terminal 10. The collectors of the transistors 184, 186, 200 and 202 are coupled to, respectively, the first current input terminal 16, the second current input terminal 24, the third current input terminal 32 and the fourth current input terminal 40, for supplying the capacitive compensation currents to the four current mirrors.

The circuit of FIG. 12 is symmetric, needs only two feed-forward capacitors, is floating and is an effective buffer of the signal terminals 1 and 3 and may advantageously be combined with the circuit of FIG. 9. The information signals $U_i$ and $NU_i$ create a voltage difference $2U_i$ across the feed-forward capacitors 178 and 180 and steers a capacitive current from the first current input terminal 16 to the fourth current input terminal 40 or from the second current input terminal 24 to the third current input terminal 32. The resistors 190, 192, 194 and 196 prevent the signal current from splitting into two parts at the emitters of the transistors.

If desired, the bipolar transistors may be replaced by unipolar transistors, for example MOS transistors. In that case base, emitter and collector should read gate, source and drain.

Figure 13:
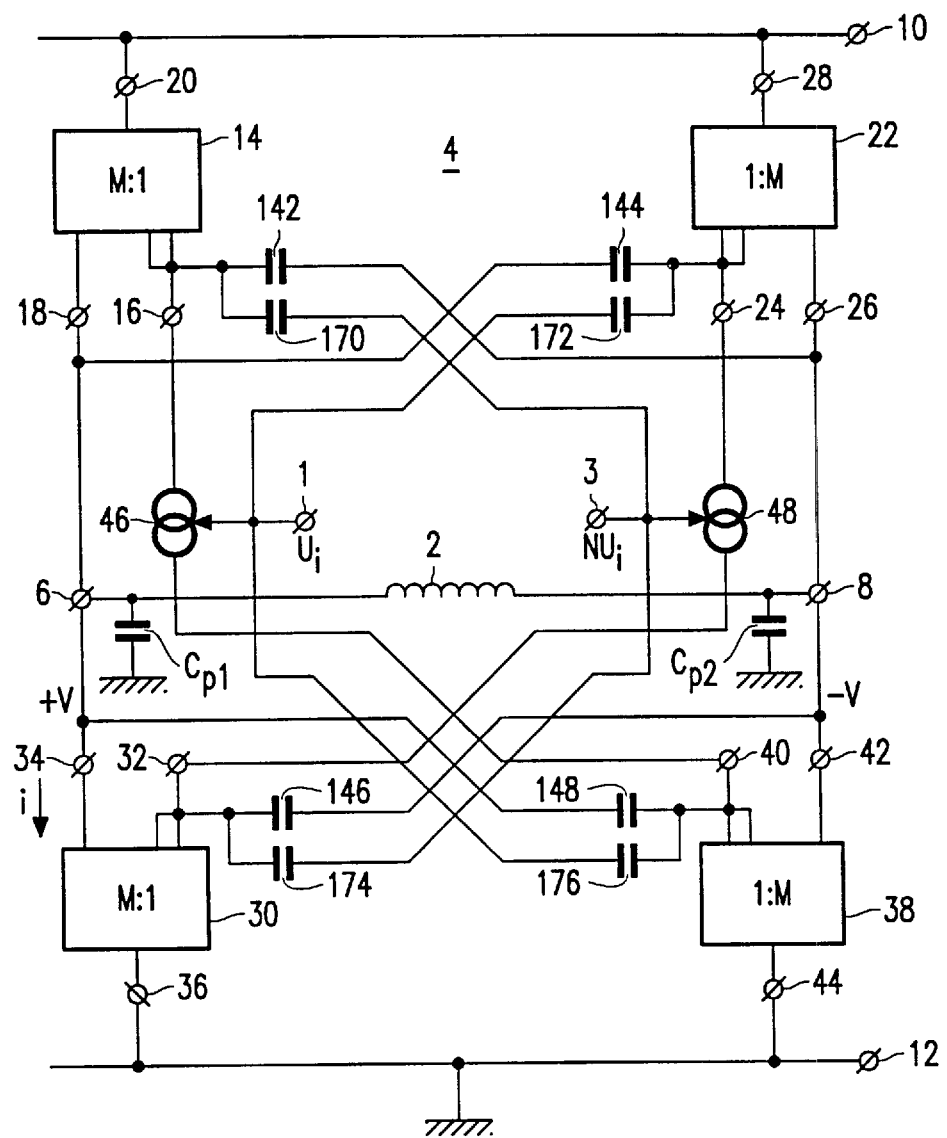
FIG. 13 shows a block diagram of a further embodiment of an arrangement for recording an information signal on a magnetic record carrier in accordance with the invention.

In addition to the capacitive feed-forward current compensation technique, a feed-back neutrodyne compensation may be used to compensate for the adverse effect of the parasitic capacitances. This is shown in FIG. 13 which is basically the same as FIG. 1. However, also FIGS. 2 and 3 can be modified in the same manner and the capacitance values used in the next explanation are shown in FIG. 2. Four additional neutralising capacitors 142, 144, 146 and 148 are provided, whose capacitance values are $C_{np}$, $C_{np}$, $C_{nn}$ and $C_{nn}$, respectively. The capacitor 142 is connected between the first current input terminal 16 and the second current output terminal 26, the second capacitor 144 between the second current input terminal 24 and the first current output terminal 18, the third capacitor 146 between the third current input terminal 32 and the fourth current output terminal 42, and the fourth capacitor 148 between the fourth current input terminal 40 and the third current output terminal.

When it is assumed that the current mirror ratio of the four current mirrors 14, 22, 30 and 38 is M the capacitance value $C_h$ seen between the write terminal 6 and the write terminal 8 will be equal to:

$$C_h = (C_{cwp} + C_{csn} + (1+M)(C_{cbp} + C_{cbn}) + (1-M)(C_{np} + C_{nn}))/2$$

This may be illustrated as follows by determining which currents flow in, for example, the third current output terminal 34 as a result of the capacitors connected to this terminal. If the voltage at the third current output terminal 34 is assumed to be V, the voltage at the fourth current output terminal 42 will be −V. The current i in the third current output terminal 34 is then:

$$i = p^*V^*C_{csn} + p^*V^*C_{cbn} + p^*V^*C_{nn} + M^*\{p^*V^*C_{cbn} - p^*V^*C_{nn}\} =$$

$$p^*V^*\{C_{csn} + (M+1)C_{cbn} - (M-1)C_{nn}\}$$

The current through the capacitor 146 has an opposite sign and is enlarged by the current mirror factor M. A similar calculation applies to the other current output terminals.

With M=5, $C_{cwp}+C_{csn}$=6 pF and $C_{cbp}+C_{cbn}$=4 pF $C_h$ will be 15 pF without neutralisation and 5 pF with neutralisation, assuming that $C_{np}+C_{nn}$=5 pF. This yields an improvement by a factor of 3.

The current mirrors and the neutralising capacitors thus provide a broad-band write amplifier with a very large output swing, which is nearly equal to the supply voltage. In addition, it is possible not only to neutralise the parasitic capacitances of the write amplifier but also to neutralise the parasitic capacitances $C_{p1}$ and $C_{p2}$ and the capacitances of the write head itself (not shown in FIG. 13) by making the neutralising capacitors sufficiently large. In that case the write amplifier 4 will oscillate when the write head 2 is disconnected. This makes it possible to detect a defective contact between the read amplifier and the write head by means of a detection circuit, which detects whether the write amplifier oscillates.

It will also be obvious that the neutralising effect is already obtained with one neutralising capacitor. However, in order to maintain the symmetry of the arrangement and to avoid unnecessary loading of a common-mode control circuit, it is preferred to use neutralising capacitors in two pairs.

The neutralising capacitors operate according to the feed-back principle and may cause ringing or instabilities when the parasitic capacitances are over-compensated. The total parasitic capacitance is often not easy predictable due to process tolerances, temperature variations, load capacitances, etc. In order to prevent excessive ringing and instabilities, the neutralising technique should under-compensate the parasitic capacitances by a large amount. Programming of the neutralising capacitors can alleviate this problem, but a substantial margin has to be kept. The above discussed feed-forward compensation can be used, if desired, in combination with the feed-back technique to fill in the margin without the risk of instabilities.

We claim:

1. A write amplifier for enabling recording of a digital information signal by an inductive write head on a magnetic record carrier; said write amplifier comprising:
    a first signal terminal (1) and a second signal terminal (3) for respectively supplying first and second signals corresponding to opposite digital values of the information signal;

a first write terminal (6) and a second write terminal (8) coupled to said write head to supply recording current thereto in a direction which corresponds to the digital value of the information signal;

a first voltage supply terminal (10) and a second voltage supply terminal (12) for providing a supply voltage to the write amplifier;

a first current mirror (14) having a first current input terminal (16), a first current output terminal (18) coupled to the first write terminal (6), and a first common current terminal (20) coupled to the first voltage supply terminal (10);

a second current mirror (22) having a second current input terminal (24), a second current output terminal (26) coupled to the second write terminal (8), and a second common current terminal (28) coupled to the first voltage supply terminal (10);

first current switching means including a first current source (46) coupled to the first signal terminal (1) for supplying current in a first current path to the first current input terminal (16), thereby causing said first current mirror (14) to supply recording current to said write head in a direction from the first write terminal (6) to the second write terminal (8) whenever the information signal has a first digital value;

second current switching means including a second current source (48) coupled to the second signal terminal (3) for supplying current in a second current path to the second current input terminal (24), thereby causing said second current mirror (22) to supply recording current to said write head in a direction from the second write terminal (8) to the first write terminal (6) whenever the information signal has a second digital value; and at least one of:
(i) first capacitive means (170) for supplying to said first current path a capacitive current which supplements current produced in said first current path by said first current source (46) when the information signal changes to said first digital value; and
(ii) second capacitive means (172) for supplying to said second current path a capacitive current which supplements current produced in said second current path by said second current source when the information signal changes to said second digital value.

2. A write amplifier as claimed in 1, characterized in that:

the second current switching means comprises a third current mirror (30) having a third current input terminal (32), a third current output terminal (34) coupled to the first write terminal (6), and a third common current terminal (36) connected to the second voltage supply terminal (12); and the first current switching means comprises a fourth current mirror (38) having a fourth current input terminal (40), a fourth current output terminal (42) connected to the second write terminal (8), and a fourth common current terminal (44) connected to the second voltage supply terminal (12).

3. A write amplifier as claimed in claim 2, characterized in that the third current mirror (30) and the fourth current mirror (38) each comprise a diode-connected input transistor of a first conductivity type having a control electrode and a second main electrode connected to the third (32) and the fourth (40) current input terminal, respectively, and having a first main electrode coupled to the second voltage supply terminal (12), and an output transistor of the first conductivity type having a control electrode connected to the control electrode of the relevant input transistor, a first main electrode coupled to the second voltage supply terminal (12), and a second main electrode connected to the third (34) and the fourth (42) current output terminal; and characterized further in that the first current mirror (14) and the second current mirror (22) each comprise a diode-connected input transistor of a second conductivity type having a control electrode and a second main electrode connected to the first (16) and the second (24) current input terminal, respectively, and having a first main electrode coupled to the first voltage supply terminal (10), and an output transistor of the second conductivity type having a control electrode connected to the control electrode of the relevant input transistor, a first main electrode coupled to the first voltage supply terminal (10), and a second main electrode connected to the first (18) and the second (26) current output terminal.

4. A write amplifier as claimed in claim 3, characterized in that the first main electrodes of the input transistors and output transistors of the first (14) and the second (22) current mirror are connected to the first voltage supply terminal (10) via resistors ($R_{ip}$, $R_{op}$), and the first main electrodes of the input transistors and output transistors of the third (30) and the fourth (38) current mirror are connected to the second voltage supply terminal (12) via resistors ($R_{in}$, $R_{on}$).

5. A write amplifier as claimed in claim 2, characterized in that it further comprises:

a first resistor (78) connected between the first write terminal (6) and a first node (80), a second resistor (104) connected between the first node (80) and the second write terminal (8), a third resistor (102) connected between the first write terminal (6) and a second node (84), a fourth resistor (82) connected between the second node (84) and the second write terminal (8);

first transistor (86) of a first conductivity type having a control electrode, a first main electrode connected to the first node (80) and a second main electrode coupled to the first voltage supply terminal (16), a second transistor (88) of the first conductivity type having a control electrode connected to the control electrode of the first transistor (86), a first main electrode, and a second main electrode connected to the control electrode of the second transistor (88), a fifth resistor (90) connected between the first voltage supply terminal (10) and the second main electrode of the second transistor (88), a third transistor (92) of the first conductivity type having a control electrode connected to the control electrode of the first transistor (86), a first main electrode connected to the first node (84) and a second main electrode coupled to the second current input terminal (24), a fourth transistor (94) of a second conductivity type having a control electrode, a first main electrode connected to the first node (80) and a second main electrode coupled to one of the third current input terminal (32) and the fourth current input terminal (40), a fifth transistor (96) of the second conductivity type having a control electrode connected to the control electrode of the fourth transistor (94), a first main electrode connected to the first main electrode of the second transistor (88) and a second main electrode connected to the control electrode of the fifth transistor (96), a sixth resistor (98) connected between the second voltage supply terminal (12) and the second main electrode of the fifth transistor (96), a sixth transistor (100) of the second conductivity type having a control electrode connected to the control electrode of the fourth transistor (94), a first main electrode connected to the second node (84) and a second main electrode coupled to the other one of the third current input terminal (32) and the fourth current input terminal (40).

6. An arrangement as claimed in claim 5, characterised in that the second node is connected to the first node.

7. An arrangement as claimed in claim 2, characterised in that the first and the second switchable current source comprise: a seventh transistor of a first conductivity type having a control electrode connected to a third node, a first main electrode, and a second main electrode coupled to the first current input terminal, an eighth transistor of the first conductivity type having a control electrode connected to the control electrode of the seventh transistor, a first main electrode, and a second main electrode coupled to the first supply terminal, a ninth transistor of a second conductivity type having a control electrode connected to a fourth node, a first main electrode connected to the first main electrode of the seventh transistor, and a second main electrode coupled to the fourth current input terminal, a diode-connected tenth transistor of the second conductivity type having a first main electrode connected to the first main electrode of the eighth transistor and having a control electrode and second main electrode connected to the fourth node, a bias current source coupled to the fourth node to supply a bias current to the fourth node, an eleventh transistor of the first conductivity type having a control electrode connected to a fifth node, a first main electrode, and a second main electrode coupled to the second current input terminal, a twelfth transistor of the first conductivity type having a control electrode connected to the control electrode of the eleventh transistor, a first main electrode, and a second main electrode coupled to the first supply terminal, and a thirteenth transistor of the second conductivity type having a control electrode connected to the fourth node, a first main electrode connected to the first main electrode of the transistor, and a second main electrode coupled to the third current input terminal.

8. An arrangement as claimed in claim 7, characterised in that the first and the second switchable current source further comprise:

a fourteenth transistor of the first conductivity type having a control electrode for receiving the information signal, a first main electrode connected to the third node and a second main electrode coupled to the first supply terminal, a fifteenth transistor of the first conductivity type having a control electrode for receiving the information signal, a first main electrode connected to the fifth node and a second main electrode coupled to the first supply terminal, a sixteenth transistor of the first conductivity type having a control electrode connected to the control electrode of the eighth transistor, a first main electrode connected to the first main electrode of the eighth transistor, and a second main electrode coupled to the fifth node, a seventeenth transistor of the first conductivity type having a control electrode connected to the control electrode of the twelfth transistor, a first main electrode connected to the first main electrode of the twelfth transistor, and a second main electrode coupled to the third node, the second main electrode of the eighth transistor being connected to the third node and the second main electrode of the twelfth transistor being connected to the fifth node.

9. A write amplifier as claimed in claim 2, characterized in that it further comprises at least one of (i) a third feed-forward capacitor (174) coupled between the third current input terminal (32) and the second signal terminal (3) and (ii) a fourth feed-forward capacitor (176) coupled between the fourth current input terminal (40) and the first signal terminal (1).

10. An arrangement as claimed in claim 2, characterised in that the write amplifier further comprises: a first resistor connected between the first write terminal and a first node, a second resistor connected between the first node and the second write terminal, a third resistor connected between the first supply terminal and the first node, and a fourth resistor connected between the second supply terminal and the first node.

11. An arrangement as claimed in claim 2, characterised in that the write amplifier further comprises: a first resistor connected between the first write terminal and a first node, a second resistor connected between the first node and the second write terminal, a first transistor of a first conductivity type having a control electrode, a first main electrode connected to the first node and a second main electrode coupled to the first supply terminal, a second transistor of the first conductivity type having a control electrode connected to the control electrode of the first transistor, a first main electrode, and a second main electrode connected to the control electrode of the second transistor, a third resistor connected between the first supply terminal and the second main electrode of the second transistor, a third transistor of a second conductivity type having a control electrode, a first main electrode connected to the first node and a second main electrode coupled to the second supply terminal, a fourth transistor of the second conductivity type having a control electrode connected to the control electrode of the third transistor, a first main electrode connected to the first main electrode of the second transistor and a second main electrode connected to the control electrode of the fourth transistor, and a fourth resistor connected between the second supply terminal and the second main electrode of the fourth transistor.

12. An arrangement as claimed in claim 2, characterised in that the write amplifier further comprises:

first, second, third and fourth driver transistors of a first conductivity type, each having a control electrode, a first main electrode and a second main electrode, the control electrodes of the first and second transistors being coupled to the first signal terminal, the control electrodes of the third and fourth transistors being coupled to the second signal terminal;

fifth, sixth, seventh and eighth transistors of a second conductivity type, each having a control electrode, a first main electrode and a second main electrode;

a first and a second bias current source, the control electrodes of the fifth and sixth transistors and the second main electrode of the fifth transistor being coupled to the second supply terminal via the first bias current source, and the control electrodes of the seventh and eighth transistors and the second main electrode of the eighth transistor being coupled to the second supply terminal via the second bias current source;

first, second, third and fourth coupling resistors for coupling, respectively, the first main electrode of the first transistor to the first main electrode of the fifth transistor, the first main electrode of the second transistor to the first main electrode of the sixth transistor, the first main electrode of the third transistor to the first main electrode of the seventh transistor, the first main electrode of the fourth transistor to the first main electrode of the eighth transistor;

a first capacitor coupling the first main electrode of the second transistor to the first main electrode of the seventh transistor and a second capacitor coupling the first main electrode of the third transistor to the first main electrode of the sixth transistor;

the second main electrodes of the first and fourth transistors being coupled to the first supply terminal; and the second main electrodes of the second, third, sixth and seventh transistors being coupled to, respectively, the first current input terminal, the second current input terminal, the third current input terminal and the fourth current input terminal.

13. An arrangement as claimed in claim 2, characterised in that the write amplifier comprises at least one of two further capacitors, of which a third capacitor is connected between the third current input terminal and the fourth current output terminal, and a fourth capacitor is connected between the fourth current input terminal and the third current output terminal.

14. A write amplifier as claimed in claim 1, characterized in that it comprises:

a differential pair comprising a first differential-pair transistor (150) of a first conductivity type and a second differential-pair transistor (152) of the first conductivity type, whose first main electrodes are coupled to receive a bias current from a bias current source (154), whose control electrodes are connected to receive the information signal and whose second main electrodes are coupled to the first current input terminal (16) and the second current input terminal (24), respectively;

a first current sensor resistor (156) connected between the second voltage supply terminal (12) and a further second current output terminal (158) of the second current mirror (22),and a second current sensor resistor (160) connected between the second supply terminal (12) and a further first current output terminal (162) of the first current mirror (14); and a first pull-down transistor (164) of the first conductivity type having a control electrode and first main electrode connected to the first current sensor resistor (156) and a second main electrode coupled to the first current output terminal (18), and a second pull-down transistor (166) of the first conductivity type having a control electrode and first main electrode connected to the second current sensor resistor (160) and a second main electrode coupled to the second current output terminal (26).

15. A write amplifier as claimed in claim 8, characterized in that the first current mirror (14) and the second current mirror (22) each comprise a diode-connected input transistor ($T_{ip}$) of a second conductivity type having a control electrode and second main electrode connected to the first (16) and the second (24) current input terminal, respectively, and a second main electrode coupled to the first voltage supply terminal (10), an output transistor ($T_{op}$) of the second conductivity type having a control electrode connected to the control electrode of the respective input transistor ($T_{ip}$), a first main electrode coupled to the first supply terminal (10), and a second main electrode connected to the first (18) and the second (26) current output terminal, respectively; and a further output transistor ($T'_{op}$) of the second conductivity type having a control electrode connected to the control electrode of the relevant input transistor ($T_{ip}$), a first main electrode coupled to the first voltage supply terminal (10), and a second main electrode connected to the further first (162) and second (158) current output terminal, respectively.

16. A write amplifier as claimed in claim 1, characterized in that the first capacitive means comprise a first feedforward capacitor (170) coupled between the first current input terminal (16) and the second signal terminal (3), and the second capacitive means comprise a second feedforward capacitor (172) coupled between the second current input terminal (24) and the first signal terminal (1).

17. An arrangement as claimed in claim 1, characterised in that the write amplifier comprises at least one of two capacitors, of which a first capacitor is connected between the first current input terminal and the second current output terminal, and a second capacitor is connected between the second current input terminal and the first current output terminal.

* * * * *

Disclaimer

5,841,603 — Joao N. V. L. Ramalho, Eindhoven (NL); Eric B. M. F. Desbonnets, Caen (FR). ARRANGEMENT COMPRISING A MAGNETIC WRITE HEAD, AND WRITE AMPLIFIER WITH CAPACITIVE FEED-FORWARD COMPENSATION. Patent dated November 24, 1998. Disclaimer filed March 28, 2008, by the assignee, U.S. Philips Corporation.

Hereby enters this disclaimer to all claims of said patent.

*(Official Gazette, April 7, 2009)*